(12) United States Patent
Kiel (10) Patent No.: US 10,734,368 B2
(45) Date of Patent: Aug. 4, 2020

(54) PARALLELISABLE METHOD FOR INTEGRATING POWER CHIPS AND POWER ELECTRONICS

(71) Applicant: INSTITUT VEDECOM, Versailles (FR)

(72) Inventor: Friedbald Kiel, Fontainebleau (FR)

(73) Assignee: INSTITUT VEDECOM, Versailles (FR)

( * ) Notice: Subject to any disclaimer, the term of this patent is extended or adjusted under 35 U.S.C. 154(b) by 0 days.

(21) Appl. No.: 16/468,448

(22) PCT Filed: Dec. 5, 2017

(86) PCT No.: PCT/FR2017/053392
§ 371 (c)(1),
(2) Date: Jun. 20, 2019

(87) PCT Pub. No.: WO2018/109315
PCT Pub. Date: Jun. 21, 2018

(65) Prior Publication Data
US 2020/0185365 A1 Jun. 11, 2020

(30) Foreign Application Priority Data
Dec. 12, 2016 (FR) .................................. 16 62335

(51) Int. Cl.
*H01L 25/18* (2006.01)
*H01L 25/11* (2006.01)
(Continued)

(52) U.S. Cl.
CPC ........ *H01L 25/117* (2013.01); *H01L 23/3114* (2013.01); *H01L 23/49838* (2013.01);
(Continued)

(58) Field of Classification Search
CPC .............................. H01L 25/18; H01L 25/117
See application file for complete search history.

(56) References Cited

U.S. PATENT DOCUMENTS

| 6,442,033 | B1 * | 8/2002 | Liu ....................... H01L 21/563 |
| | | | 174/538 |
| 9,418,930 | B2 * | 8/2016 | Stahr ................... H01L 23/3121 |
| 2016/0133558 | A1 | 5/2016 | Stahr et al. |

FOREIGN PATENT DOCUMENTS

DE        102014010373 A1    1/2015

OTHER PUBLICATIONS

International Search Report for PCT/FR2017/053392 dated Mar. 26, 2018.
Written Opinion for PCT/FR2017/053392 dated Mar. 26, 2018.

* cited by examiner

*Primary Examiner* — Hai L Nguyen
(74) *Attorney, Agent, or Firm* — Sandberg Phoenix & von Gontard. P.C.

(57) ABSTRACT

The method comprises the steps of 1) producing first and second blanks (EB1) including reserved-space defining means (HM1, HM2), by laminating insulating and conductive inner layers (PP, CP) on copper plates forming a base (MB1), at least one electronic chip being sandwiched between the blanks, said blanks being produced such that their upper lamination surfaces have matching profiles, 2) stacking and fitting the blanks via their matching profiles, and 3) press-fitting the blanks to form a laminated subassembly for an integrated power electronics device. The method uses IMS-type techniques.

13 Claims, 7 Drawing Sheets

(51) Int. Cl.
*H01L 23/538* (2006.01)
*H03K 17/60* (2006.01)
*H01L 23/31* (2006.01)
*H01L 23/498* (2006.01)

(52) U.S. Cl.
CPC ...... *H01L 23/5385* (2013.01); *H01L 23/5389* (2013.01); *H01L 25/18* (2013.01); *H03K 17/60* (2013.01)

FIG.12 ial Application No. PCT/FR2017/053392 filed 5 Dec. 2017, which claims priority to French Application No. 1662335, filed on 12 Dec. 2016, the content (text, drawings, and claims) of both being incorporated herein by reference.

PARALLELISABLE METHOD FOR INTEGRATING POWER CHIPS AND POWER ELECTRONICS

CROSS-REFERENCE TO RELATED APPLICATIONS

This application is the U.S. National Stage under 35 USC § 371 of International Application No. PCT/FR2017/053392 filed 5 Dec. 2017, which claims priority to French Application No. 1662335, filed on 12 Dec. 2016, the content (text, drawings, and claims) of both being incorporated herein by reference.

BACKGROUND

In general, the invention regards the field of power electronics. More specifically, the invention regards a procedure for integrating electronic power chips that allows parallel production. The invention also regards devices and electronic power modules obtained by implementing the above-mentioned procedure.

The integration of electronic power chips for the production of circuits is a sequential process, in essence. It results from rather high production times, depending on the circuits, which can have a significant impact on costs. Parallelizing a production process is a well-known solution to reduce production time and increase volumes, but it often requires heavy investment if there is no technological progress to facilitate it.

Electronic power circuits, such as power modules, have a strong presence in many sectors, such as transport, industry, lighting, and heating, among others. With the desired shift toward renewable energy and energy that produces less $CO_2$ emissions, electronic power will be more widely used and will have to respond to growing economic and technological constraints. For example, in the area of transport, the automobile industry is subject to very strict pollution emission standards that have led to the technological transformation and the electrification of vehicles. The electrification of vehicles, in the context of heavy restrictions on weight, traffic, and cost that predominate this mass production industry, requires technological progress in the procedure for integrating electronic power chips.

In the current state of the art, it is common to use HDI (High Density Interconnect) technology to increase the level of integration and reduce the size of power modules. The HDI technology generally implemented on the PCB (Printed Circuit Board) circuits is based on an optimization of the spatial implantation of the components but using, in particular, thinner interconnect ribbons and interconnect microholes, called microvias. Laser beam piercing is used as well as different welding techniques, such as brazing or transient liquid phase bonding (TLP bonding) or powder sintering of metallic nanoparticles.

It is also common to pile up printed circuit cards to make 3D architectures. Thus, application DE102014010373A1 proposes an electronic module that includes the first and second printed circuit cards superimposed on one another, each including an electronic component. A sintering procedure is used to connect the cards. Furthermore, application US2016/133558A1 describes a power module including a central printed circuit card that is sandwiched between two heat-dissipating plates. Electronic components are installed in the central card.

HDI technology, however, is limited with regard to the cost reductions needed for mass production and for increasing the level of integration and compactness. Indeed, certain techniques used, like piercing by laser beam, do not make it easier to parallelize the production process and are an obstacle to price reduction.

The level of integration that is possible to obtain is limited by the volume occupied by interconnects with ribbons and microvias. These interconnects with ribbons or cables introduce parasitic inductances that resist higher switching or chopping frequencies. In order to reduce the heat generated and protect the circuit from potentially destructive power surges, we must reduce the parasitic inductances. But the increase in the switching frequencies favors compactness, particularly in power convertors.

The growth of the level of integration and the compactness of the electronic power modules accent the thermal constraints on the components. Effective cooling is needed to maintain the temperatures of the active components below critical values in order to reach a thermal equilibrium and guarantee reliability of the power modules. For this, the architecture of the power modules and the technologies used must make it possible to extract the energy dissipated as close as possible to the components.

It now appears desirable to offer a new technology that would allow advances in parallel production of integrated power electronic devices, such as power modules, as well as in the integration of the electronic chips and the compactness of the devices.

BRIEF SUMMARY

According to a first aspect, a procedure of integrating electronic power chips is disclosed so to create a stratified sub-assembly intended for an integrated electronic power device. According to the invention, the procedure includes:

An embodiment of first and second blanks including a use space conservation means, each of the blanks being created by stratifying internal isolation and conductive layers on a plate forming a metallic base, at least one electronic chip being installed in either of the first and second blanks being created with complementary profiles of their raised stratification surfaces;

Piling and joining the first and second blanks by their raised surfaces with complementary profiles; and Press-fitting the first and second blanks to create the stratified sub-assembly created for the integrated electronic power device.

According to a particular characteristic, the space conservation means are used to create at least one position for at least one chip.

According to another particular characteristic, the embodiment of the first and second blanks also includes the use of elements for indexing and installing in order to embody at least one of the inner layers.

According to another particular characteristic, the stratification of the isolating and conductive inner layers of the first and second blanks is done on a plate that forms a copper metallic base.

According to another particular characteristic, during the embodiment of the first and second blanks, the stratified internal isolating and conductive layers are formed using the IMS technique.

According to another particular characteristic, during the embodiment of the first and second blanks, the B-stage dielectric portions of sheet molding are done via die-cutting and/or by blade and are installed in the respective locations of the blanks.

According to another particular characteristic, in the embodiment of the first and second blanks, conductive portions are created from a copper sheet through a die-cutting and/or spindle rotation cutting and/or cut by blade, and are installed in the respective locations of the blanks.

According to another particular characteristic, according to the embodiment of the first and second blanks, dielectric and conductive portions are created from a copper-coated roll through a die-cutting and/or spindle rotation cutting and/or cut by blade or laser, and are installed in the respective locations of the blanks.

According to another particular characteristic, during the embodiment of the first and second blanks, the formation of inner layers includes precisely defining the connection patterns by photolithography.

According to another particular characteristic, during the embodiment of the first and second blanks, the formation of inner layers includes storing a first-level electrical interconnect material in determined locations, including locations specific to at least one electronic chip placed using a soldering paste.

According to another particular characteristic, press-fitting of the first and second blanks includes baking in the vacuum stratification oven.

According to another aspect, an integrated electronic power device in the form of an electronic power module is disclosed, the device including the first and second stratified sub-assemblies created by implementing the procedure as briefly described above and a central cooling fluid circulation space located between the first and second sub-assemblies, the first and second stratified sub-assemblies being superimposed over one another and connected together and comprising, respectively, the first and second electronic power interrupters and forming a bridge arm.

According to a particular characteristic, the electronic power interrupters are MOSFET—or IGBT-type transistors.

DESCRIPTION OF THE FIGURES

Other advantages and characteristics of this invention will become clearer after reading the detailed description below of the several particular embodiments of the invention, in reference to the attached drawings, in which.

DETAILED DESCRIPTION

A particular embodiment of the procedure is now described above as a part of the embodiment of a power module in the form of a bridge arm, or half-bridge, of switching transistors.

Figure 1A:
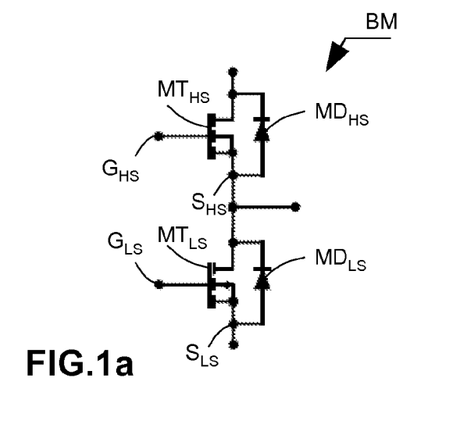
FIGS. 1a and 1b show two diagrams of transistor bridge arms with MOSFET and IGBT transistors.
Figure 1B:
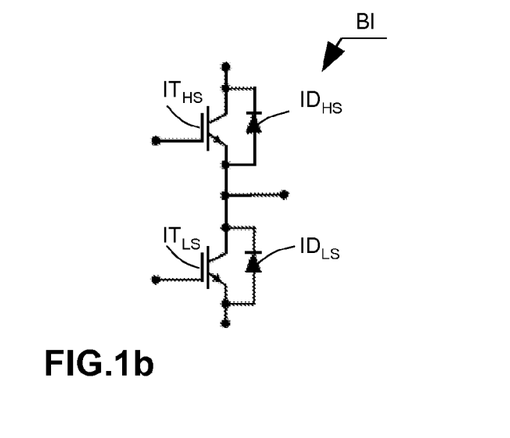

Two examples of power modules are represented in FIGS. 1a and 1b. These modules can be joined to form complete switching bridges or connected in parallel to pass the desired current.

As shown in FIGS. 1a and 1b, these power modules comprise one bridge (or half-bridge) arm, switching transistor. The bridge arm traditionally includes a high side and a low side and the associated diodes. FIG. 1a shows a schema of a first bridge arm BM comprising MOSFET, $MT_{HS}$ and $MT_{LS}$ transistors and $MD_{HS}$ and $MD_{LS}$ diodes, respectively attached to the transistors. FIG. 1b shows a schema of a second bridge are BI comprising IGBT, $IT_{HS}$ and $IT_{LS}$ transistors and their associated $ID_{HS}$ and $ID_{LS}$ diodes.

In the description below, it is considered that the power module produced is a bridge arm BM as shown in FIG. 1a, meaning including two MOSFET transistors, $MT_{HS}$ and $MT_{LS}$, and diodes, $MD_{HS}$ and $MD_{LS}$, respectively associated to the transistors. In certain configurations, the diodes associated to the transistors will be already integrated in the transistor chips, so they do not need to be installed. Note that the power module production and the bridge arm both have one single reference mark. We also note that this description applies to the bridge arm BI of FIG. 1b by replacing the MOSFET transistors with IGBT transistors.

In general, known and well-controlled electronic power production techniques are used, coming essentially from IMS (Isolated Metal Substrate) technology. Thus, the procedure may use a combination of different production techniques including stratification, photolithography, electrodeposition of metal, wet-etching and others. For welding the components, the technique used could be transient liquid phase bonding (TLP bonding), powder sintering of metallic nanoparticles or diffusion welding. Die-cutting will also be used for cutting into films or isolation and copper sheets of elements carried over in the blank of the module being produced. Indexation and placement means will also be used, as well as space-conservation means during the carry-over operations on the blank.

Also with reference to FIGS. 2 to 10, the different steps of the production occurring in the electronic power chip integration procedure are described in detail. These steps make it possible to create the stratified inner layers present in a power module and a general sandwiched architecture.

Figure 2:
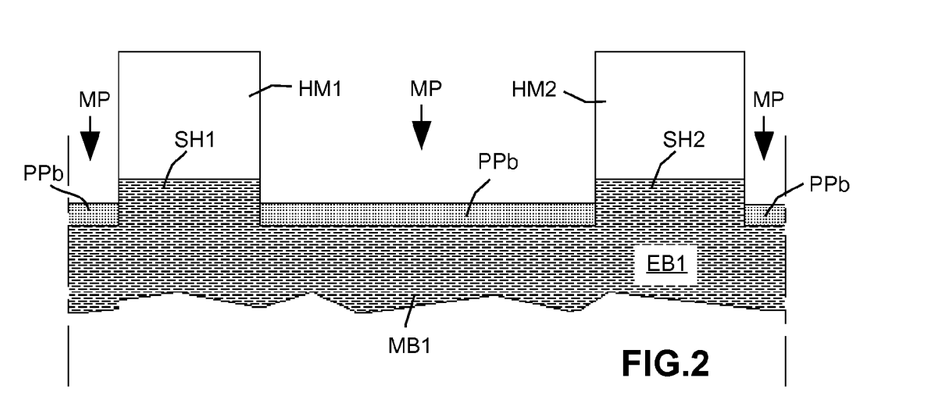
FIGS. 2 to 10 are simplified sectional views showing the steps of the integration procedure of the electronic chips.

FIG. 2 represents a blank EB1, at an initial stage, of a sub-assembly of a power module.

In the production step of FIG. 2, the space-conserving elements HM1 and HM2 are prima facie set up on the raised surfaces SH1 and SH2 of a plate MB1 forming a metallic base, respectively. The metallic base MB1 is preferably in copper.

As seen in FIG. 2, the metallic base MB1 preferably appears in a way that forms the raised surfaces HM1 and HM2 and locations MP. The prior profile of the metallic base MB1 is typically obtained by mechanical removal of the material or by photolithography.

Dielectric portions PPb of B-stage sheet moldings are placed on the base plate MB1 in locations MP respective to it. These dielectric portions PPb of B-stage sheet moldings here are typically woven glass fiber dielectrics coated with an epoxy-type resin and partially polymerized. Other dielectrics such as Teflon (registered trademark) or polyimide could still be used for special applications. The dielectric portions PPb could be obtained from die-cutting a B-stage sheet molding, or even by spindle cutting or cutting by blade.

Figure 3:
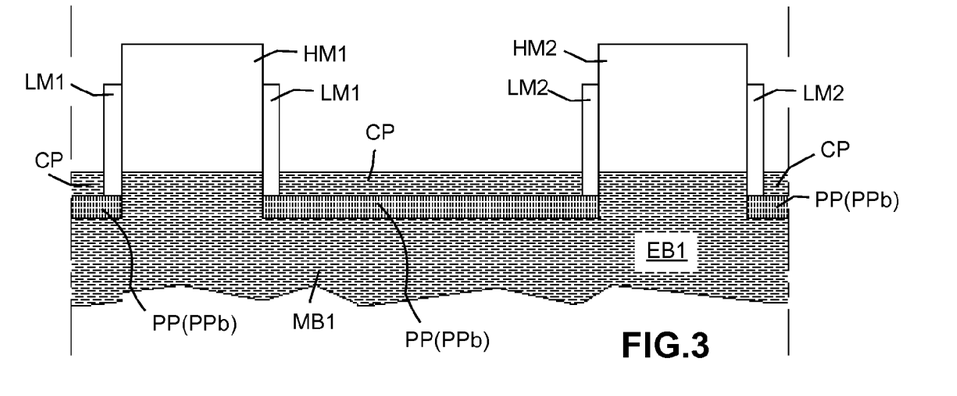

In the step shown in FIG. 3, indexation and implementation elements LM1 and LM2 are placed on both sides of the space conservation elements HM1 and HM2. These elements LM1 and LM2 buffer against the conductive portions PPb and are there to define the space of the conductive portions CP in copper that partially cover the dielectric portions PPb. The parts NC that are not covered by conduction portions CP, shown in FIG. 4, are left at the lateral walls of the positions MP.

The conductive portions CP are obtained from a copper sheet via die-cutting or by a spindle or blade cutting. The stratification of the layers of the portions PPb and CP on the metallic base MB1 is obtained via vacuum pressing or vacuum baking. The dielectric portions PPb are shown in FIG. 3 in their polymerized form in a dielectric layer PP.

Alternatively, it is possible to obtain the stratified blank EB1 of FIG. 3 from a copper clad laminate (CCL). The portions of laminate formed from a dielectric layer and a copper coating are cut in a laminate panel and carried over in the MP locations that can, if necessary, be coated in resin in advance. The stratification of the laminate portions on the metallic base MB1 is obtained by vacuum press or baked via stratified vacuum-oven.

Figure 4:
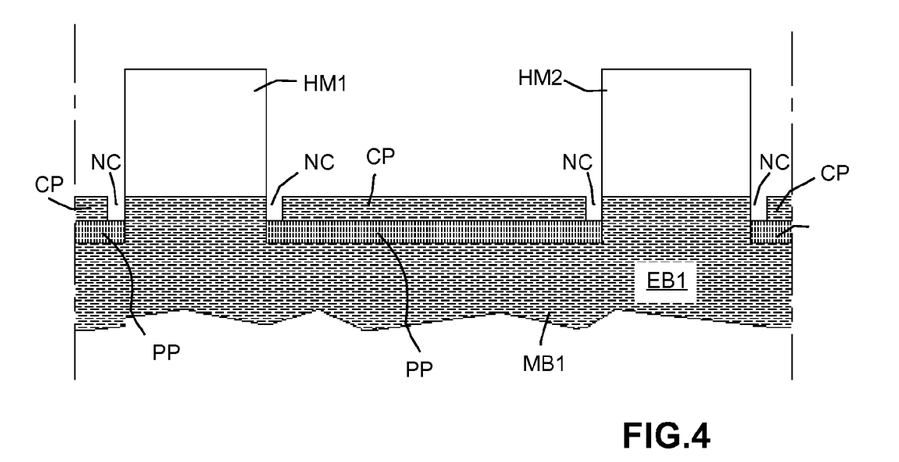

In FIG. 4, the indexation and setup elements LM1 and LM2 were removed and show the parts NC not covered by the conductive portions CP.

Figure 5:
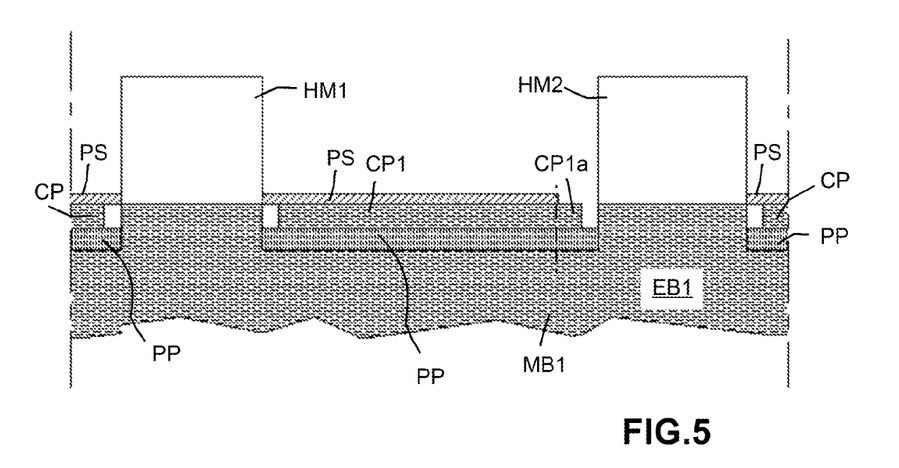
Figure 6:
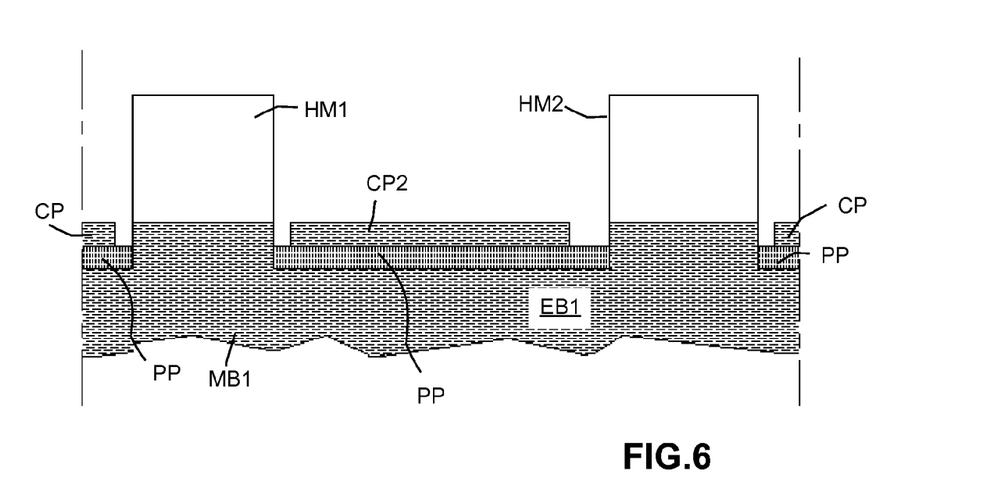

Steps of FIGS. 5 and 6 show a photolithography operation meant to define with high precision the copper connection patterns. In these figures, for example, we show the adjustment of a width of a conductive portion CP1 from the side of a lateral wall of the raised surface SH2.

In FIG. 5, a photoresist resin PS is coated onto the raised stratification surfaces of the blank EB1. The parts of the surfaces to tackle using wet etching are then defined and cleared traditionally using a serigraphy mask and ultraviolet ray exposure.

In FIG. 5, blank EB1 is shown ready for the wet etching of the copper. A metallic portion CP1$a$ is removed and the connection pattern is thus created with precision.

In step 6, the photoresist resin PS was removed by known methods, such as treatment by plasma oxygen, dry pickling or via solvent. As shown in FIG. 6, the connection pattern includes a conductive portion CP2 defined with precision after the etching of the portion CP1.

Figure 7:
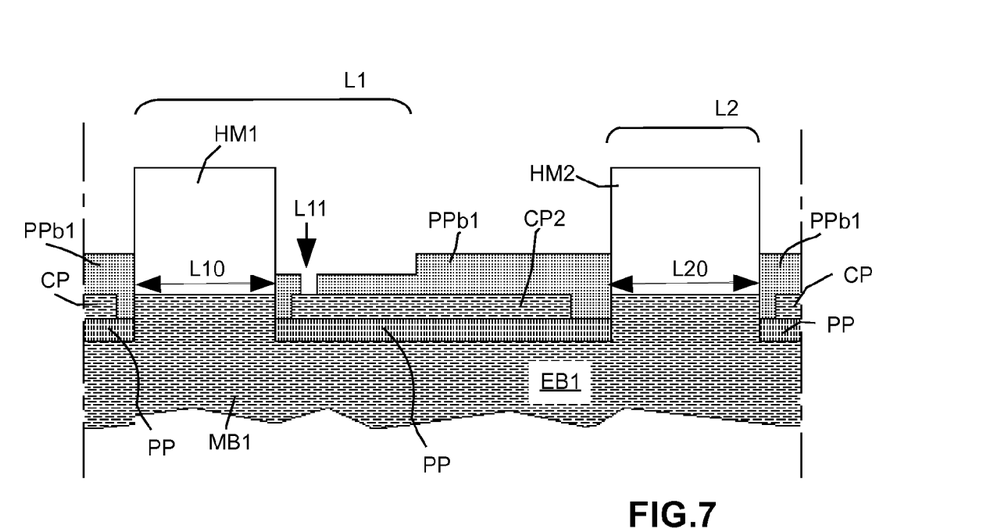

The step shown in FIG. 7 regards the shaping of the locations L1 and L2 where the chip of a transistor MT and the chip of a diode MD are supposed to go. The spaces kept by elements HM1 and HM2 are specific to, respectively, locations L1 and L2.

In the step of FIG. 7, dielectric portions PPb1 of B-stage sheet moldings are placed in several layers on the surface part of the blank EB1. This step makes it possible to configure the cavities and the electric isolation parts needed to lay the electric interconnect material and to install the electronic chips. The dielectric portions PPb1 are obtained and installed in a similar way to the PPb portions of FIG. 2.

The location L1 includes two cavities L10 and L11 where the electric interconnect material is supposed to go. The cavity L10 corresponds to the space reserved by the element HM1 and is intended for electric contact between the base plate MB1 and a drain electrode ($D_{HS}$ or $D_{LS}$ in FIG. 1$a$) of the transistor MT. The cavity L11 is formed by laying the dielectric portions PPb1 and is intended for electric contact between the conductive portion CP2 and a gate electrode ($G_{HS}$ or $G_{LS}$ in FIG. 1$a$) of the transistor MT.

Location L2 includes cavity L20 fully defined by the space conservation element HM2 which is meant for electric interconnect material. The cavity L20 is to be used for electric contact between the base plate MB1 and a cathode electrode (FIG. 1$a$) of the diode MD.

Figure 8:
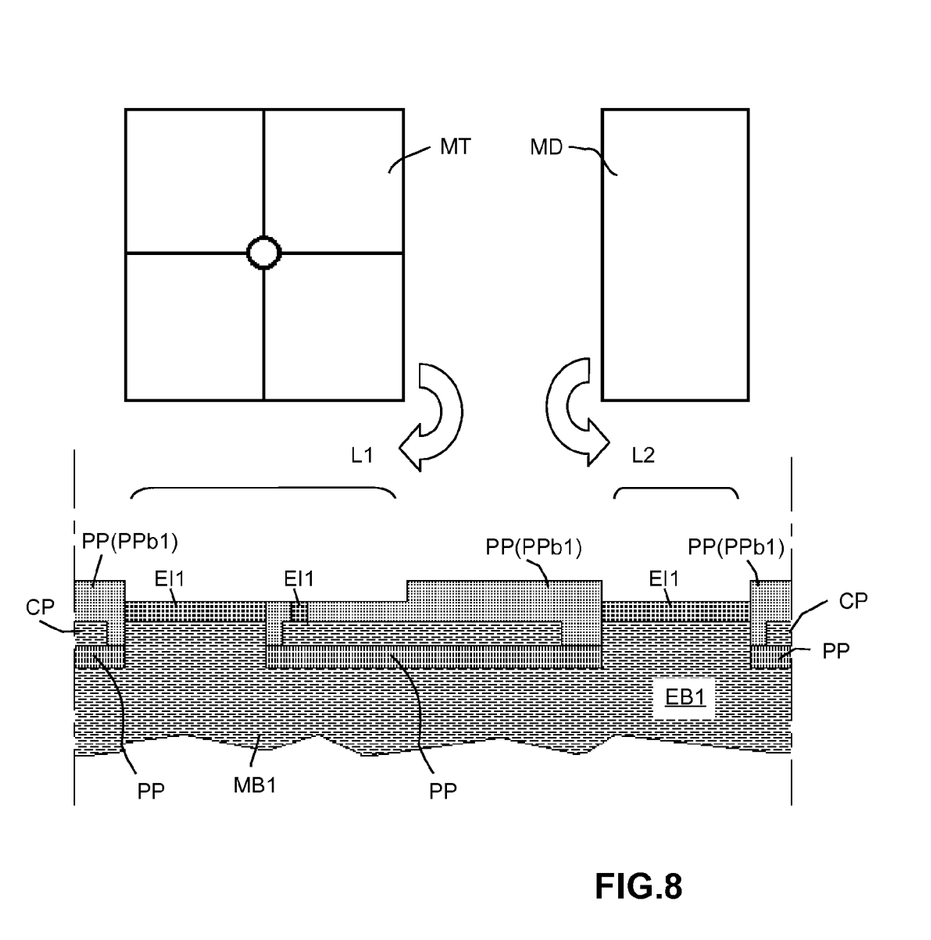

In the step of FIG. 8, the space conservation elements HM1 and HM2 are removed and the chips of the components MT and MD are set up in the locations L1 and L2 after laying an electric interconnect material.

In FIG. 8, the dielectric portions PPb1 of B-stage sheet molding are shown as totally polymerized, forming dielectric layers PP. We note, however, that this production step can be complete even when the portions PPb1 remain totally unpolymerized.

As shown in FIG. 8, the electric interconnect material EI1 is laid in the cavities L10, L11 and L20. The electric interconnect material EI1 is typically a soldering paste that is adapted to an FLI-type (First Level Interconnect) interconnect. The first level interconnect material is placed using a solder paste spreader.

Figure 9:
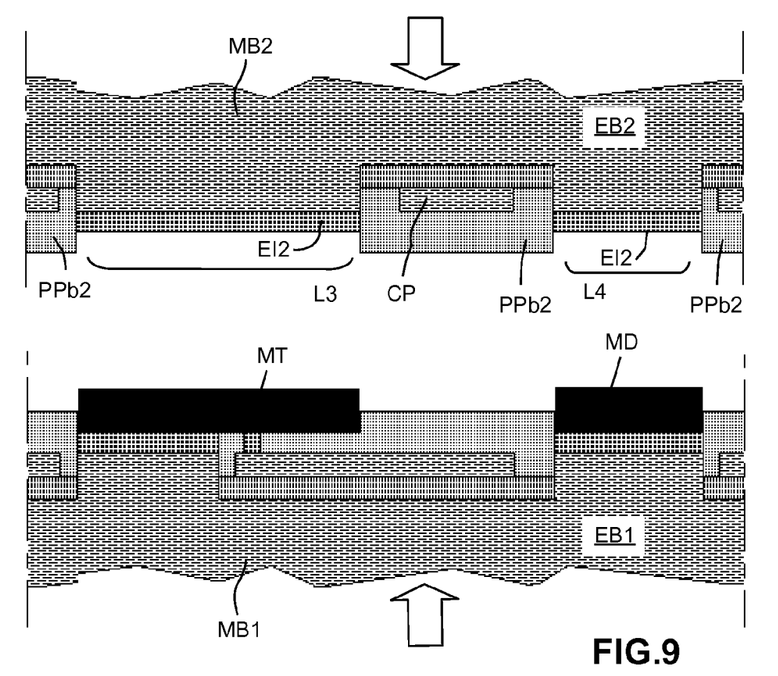

FIG. 9 shows the assembly of the blank EB1, obtained by the production steps of FIGS. 2 to 8, and a complementary blank EB2. The blank EB2 is produced following production steps similar to those of the blank EB1. We note that the blanks EB1 and EB2 are produced in parallel on different production lines, which makes it possible to significantly reduce production time.

As shown in FIG. 9, the profile of the raised stratification surface of the blank EB2 is complementary to and couples with that of the blank EB1.

The blank EB2 includes locations L3 and L4 that correspond, respectively, to locations L1 and L2 of the blank EB1. The surfaces of locations L1 and L2 are covered in a first level electric interconnect material EI2, identical to the material EI1 of the substrate EB1, for the electric connection of a source electrode ($S_{HS}$ or $S_{LS}$ in FIG. 1$a$) and an anode electrode (FIG. 1$a$) of the transistor MT and diode MD chips to a plate BM2 forming the metallic base of the blank EB2, respectively.

The blank EB2 includes the dielectric portions PPb2 of the B-stage sheet molding that are arranged in line with the dielectric portions PP(PPb1) of the blank EB1.

As it appears in FIG. 9, the blanks EB1 and EB2 are plated against one another and enclose the chips of the components MT and MD in their inner layers. The final assembly and obtaining of the stratified sub-assembly are done via vacuum pressing or via baking in the vacuum oven. The final polymerization of the dielectric portions and the connections of the electric interconnect material takes place during this final assembly.

Figure 10:
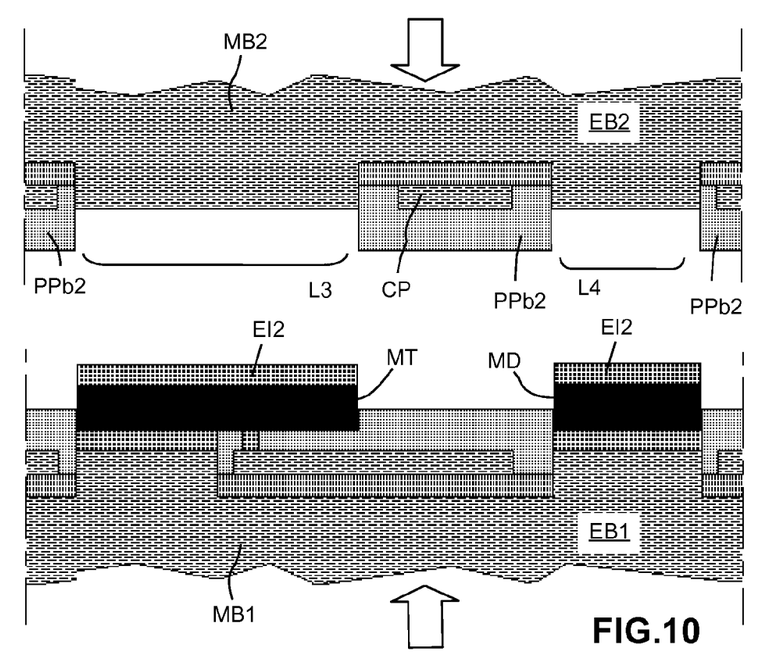

FIG. 10 shows a variant of the assembly step of FIG. 9. In this variant, the first level electric interconnect material EI2 is placed on the raised sides of the electronic chips MT and MD in line with locations L3 and L4 of the blank EB2. The final assembly is then carried out in the same way as described above for FIG. 9.

The procedure, as described above with reference to FIGS. 2 to 10, authorizes production of the power sub-assemblies or electronic power devices with a sandwiched stratified architecture. Compared to other known technologies, such as HDI technology, the procedure proposed here authorizes both a reduction of production time, provided by the parallelization of the chip integration process and the use of proven and cost-effective IMS techniques, improved performance and increased compactness. The optimization of the internal connection link of the sub-assemblies, done with neither vias nor microvias, makes it possible to reduce the parasitic inductances and integrate further. The sandwiched architecture with two copper plates (MB1, MB2), close and arranged on both sides of the electronic components, largely facilitates the evacuation of the dissipated heat, due to the high mass of heat-conductive copper on both sides of the components.

Figure 11:
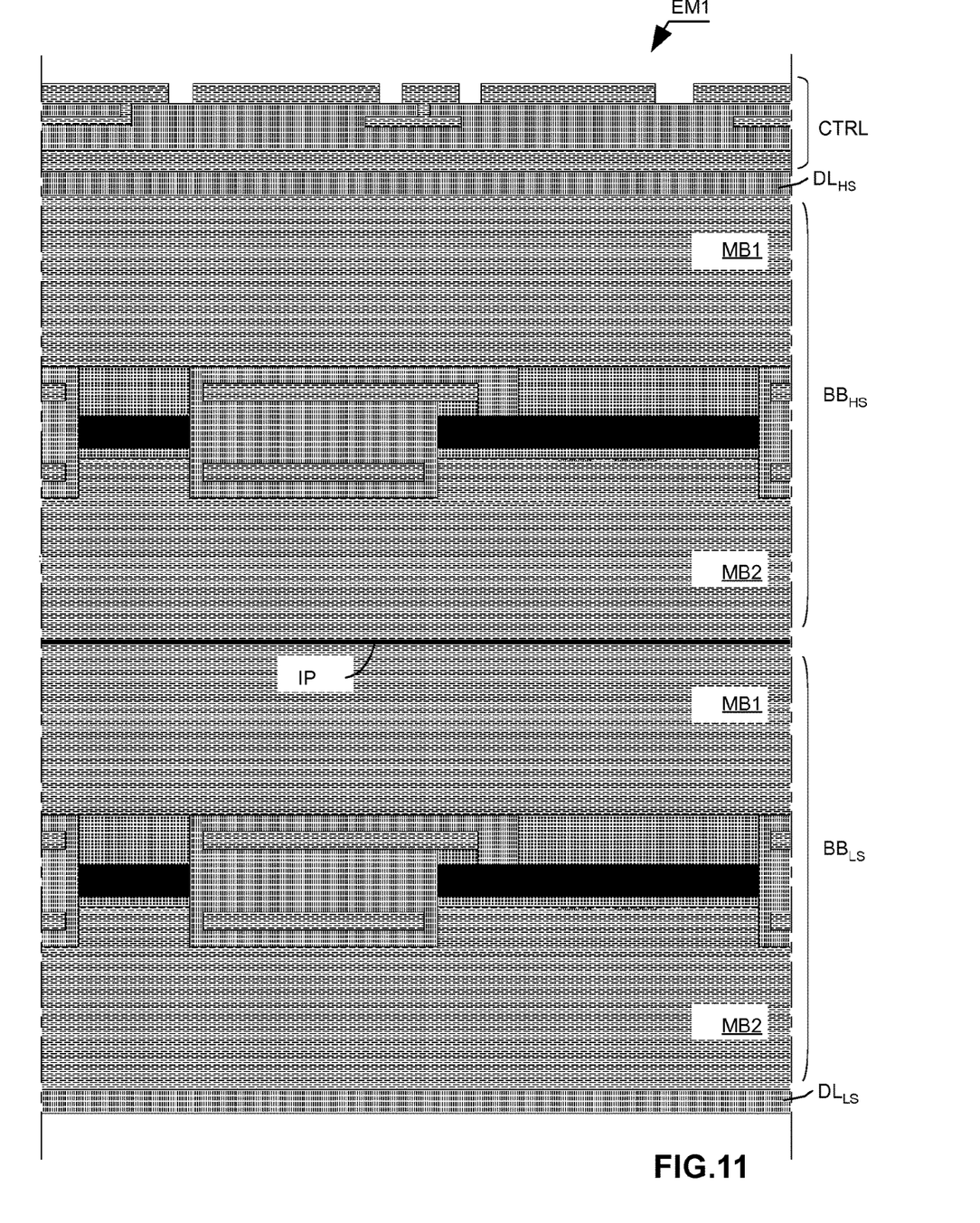
FIGS. 11 and 12 are simplified sectional views showing the first and second embodiments of a power module, for an air-cooling module and a fluid-cooling module.
Figure 12:
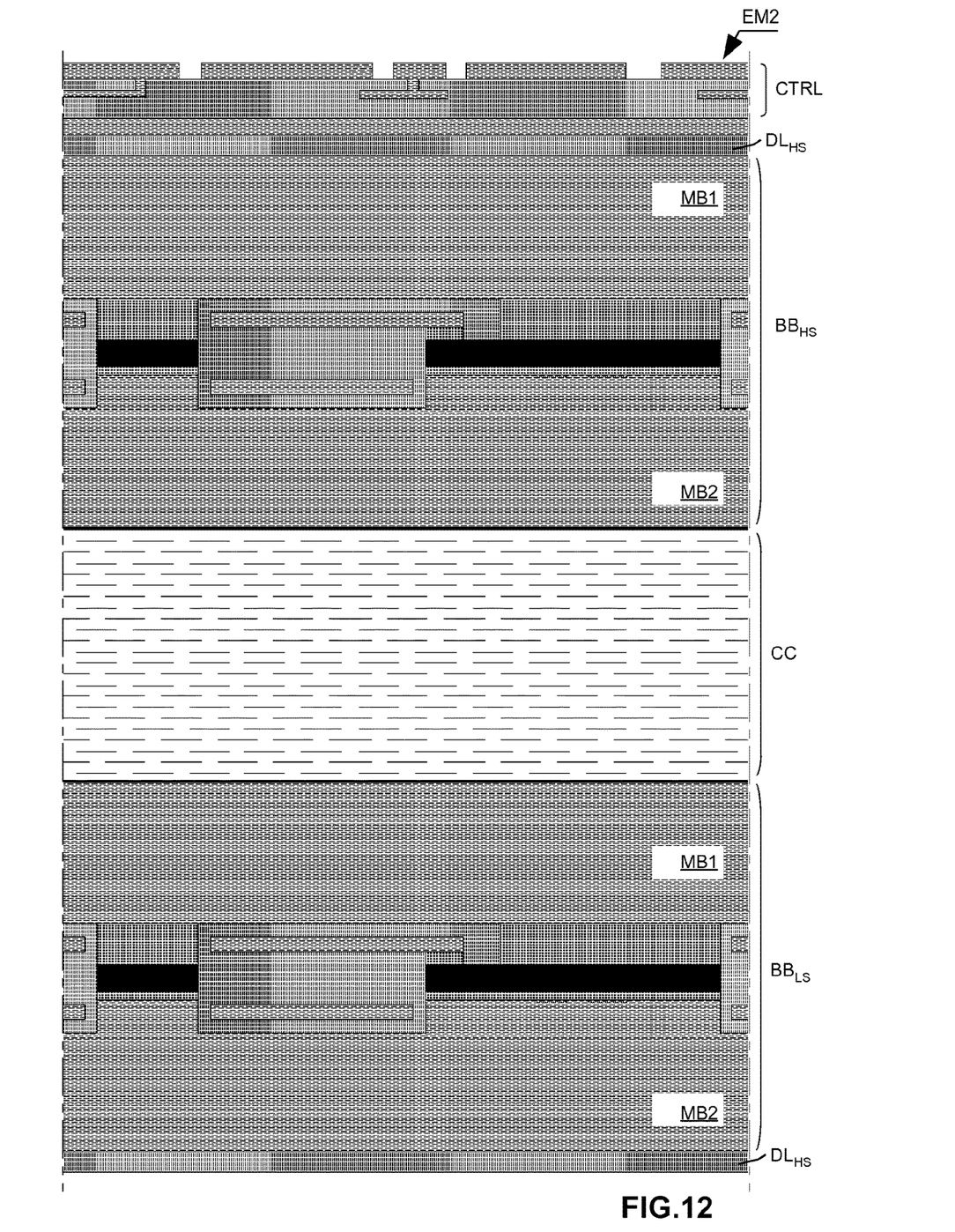

In reference to FIGS. 11 and 12, we now describe the first and second particular embodiments EM1 and EM2 of a power module in the form of a bridge arm, as shown in FIGS. 1$a$ and 1$b$.

These power modules EM1 and EM2 are built via piling two stratified sub-assemblies $BB_{HS}$ and $BB_{LS}$ produced in a similar way to that described above in reference to FIGS. 2 to 10.

Generally, the stratified sub-assemblies are building blocks that can be assembled to create rather complex integrated electronic power devices. The assembly of two piled building blocks is typically done via press-fitting and baking. The mechanical and electrical connections between the two bricks will be provided via welding.

The module EM1 shown in FIG. 11 is an air-cooled embodiment. A power converter formed by the assembly of several power modules EM1 could be equipped, if needed, with heat dissipation means. These heat dissipation means will include one or more electrically isolated heat contact radiators with copper parts MB1 and MB2. The architecture of the module makes it possible to effectively extract the heat dissipated with the traditional radiators, thus avoiding a certain number of applications from using the more costly means, such as phase-change cooling devices.

The mechanical and electrical connection at the level of the joining plain IP between the blocks $BB_{LS}$ and $BB_{HS}$ of FIG. 10 could be obtained by transient liquid phase (TLP) bonding, bonding by sintering or by the other welding techniques mentioned above.

As shown in FIG. 11, the module EM1 here is equipped with a command circuit CTRL arranged at the high part of the module and electrically isolated by a dielectric layer $DL_{HS}$ of the copper part MB1 of the block $BB_{HS}$. A dielectric layer $DL_{LS}$ is placed on the lower part of the module and provides electric isolation of this part of the block $BB_{HS}$. The circuit CTRL includes several stratified layers carried out following the techniques described above. Active and passive components may, if needed, be buried between the inner layers of the circuit CTRL, or even installed traditionally on the surface of the circuit via brazing or electroconductive adhesive.

The module EM2 shown in FIG. 12 is a liquid-cooling embodiment that is adapted to high-power uses.

Other than the blocks $BB_{LS}$ and $BB_{HS}$, the command circuit CTRL arranged on the high part of the module and the dielectric layers $DL_{HS}$ and $DL_{HS}$, in a manner similar to the module in FIG. 11, the module EM2 also includes a space for the circulation of the cooling fluid CC. A dielectric cooling fluid under pressure can be, for example, used as a coolant fluid. The space CC is planned in the central part of the module EM2, in direct contact with the copper plates MB1 and MB2 of the blocks $BB_{LS}$ and $BB_{HS}$, respectively.

Other embodiments of the power modules according to the invention are of course possible, for example via a module that also includes cooling fluid circulation spaces in the high and low part of the module. The blocks $BB_{LS}$ and $BB_{HS}$ are then cooled by the cooling liquid circulating on both parts of each block $BB_{HS}$, $BB_{LS}$ in a way that extracts calories.

The invention is not limited to the particular embodiments which are described here as an example. A person skilled in the art, according to the uses of the invention, could make different changes and variants that fall within the scope of the claims attached hereto.

The invention claimed is:

1. A procedure for integrating electronic power chips for the embodiment of a laminated sub-assembly to be used for an integrated electronic power device wherein the procedure includes:
producing first and second blanks using space conservation means, each of said blanks being made by lamination of internal isolating and conductive layers on a plate forming a metallic base, at least one electronic chip installed in either of said first and second blanks, and said first and second blanks being made with raised stratification surfaces having complementary profiles;
stacking and interlocking said first and second blanks by their raised surfaces with the complementary profiles; and
press-fitting of said first and second blanks to produce said laminated sub-assembly ($BB_{HS}$, $BB_{LS}$).

2. The procedure according to claim 1, wherein said means for conserving space is used to produce at least one location intended for at least one chip.

3. The procedure according to claim 1, wherein the production of said first and second blanks also includes the use of indexation and setup elements to create at least one of said inner layers.

4. The procedure according to claim 1, wherein during the production of said first and second blanks, the lamination of the internal isolating and conductive layers of said first and second blanks is done on a plate forming the copper metallic base.

5. The procedure according to claim 1, wherein during the production of said first and second blanks, said laminated internal isolating and conductive layers are formed with IMS-type techniques.

6. The procedure according to claim 1, wherein during the production of the first and second blanks, the dielectric portions of the B-stage sheet molding are carried out from a B-stage sheet molding via die-cutting and/or spindle cutting and/or cut by blade and are installed in the respective locations of said blanks.

7. The procedure according to claim 1, wherein in the production of said first and second blanks, the conductive portions are made from a copper sheet by die-cutting and/or spindle cutting and/or cut by blade and are installed in the respective locations of said blanks.

8. The procedure according to claim 1, wherein in the production of said first and second blanks, the dielectric and conductive portions (PP, CP) are made from a blade copper clad laminate (CCL) by a die-cutting and/or a spindle cutting and/or cut by blade, and are installed in the respective locations of said blanks.

9. The procedure according to claim 1, wherein during the production of said first and second blanks, the formation of said inner layers includes a precise definition of connection patterns by photolithography.

10. The procedure according to claim 1, wherein during the production of said first and second blanks, the formation of said inner layers includes the placement of a first level electric interconnection at determined locations including locations specific to at least one electronic chip, said placement being done using a soldering paste spreader.

11. The procedure according to claim 1, wherein the press-fitting of said first and second blanks includes a vacuum oven step.

12. An integrated electronic power device in the form of an electronic power module, wherein the power device includes the first and second laminated sub-assemblies produced by implementing the procedure according to claim 1 and a central space for cooling fluid circulation arranged between said first and second sub-assemblies being superimposed and connected together and respectively including the first and second electronic power interrupters forming a bridge arm.

13. Device according to claim 12, wherein said electronic power interrupters are MOSFET or IGBT type transistors.

* * * * *